United States Patent
Li et al.

(10) Patent No.: US 11,563,407 B2
(45) Date of Patent: Jan. 24, 2023

(54) MIXING CIRCUIT WITH HIGH HARMONIC SUPPRESSION RATIO

(71) Applicants: VeriSilicon Microelectronics (Shanghai) Co., Ltd., Shanghai (CN); VeriSilicon Holdings Co., Ltd.

(72) Inventors: Yu Li, Shanghai (CN); Peng Ma, Shanghai (CN); Yi Zeng, Shanghai (CN); Shenglei Wang, Shanghai (CN); Tony Qian, Shanghai (CN)

(73) Assignees: VeriSilicon Microelectronics (Shanghai) Co., Ltd., Shanghai (CN); VeriSilicon Holdings Co., Ltd., Grand Cayman (KY)

( * ) Notice: Subject to any disclaimer, the term of this patent is extended or adjusted under 35 U.S.C. 154(b) by 0 days.

(21) Appl. No.: 17/037,692

(22) Filed: Sep. 30, 2020

(65) Prior Publication Data
US 2021/0281218 A1    Sep. 9, 2021

(30) Foreign Application Priority Data
Mar. 3, 2020    (CN) .......................... 202010139700.4

(51) Int. Cl.
*H03D 7/14*    (2006.01)
*H03D 7/16*    (2006.01)
*H04B 1/04*    (2006.01)

(52) U.S. Cl.
CPC ......... *H03D 7/1425* (2013.01); *H03D 7/1475* (2013.01); *H03D 7/165* (2013.01); *H04B 1/0475* (2013.01); *H03D 2200/0082* (2013.01)

(58) Field of Classification Search
CPC .... H03D 7/1425; H03D 7/1475; H03D 7/165; H03D 2200/0082; H03D 7/12; H04B 1/0475
See application file for complete search history.

(56) References Cited

U.S. PATENT DOCUMENTS

| | | | | |
|---|---|---|---|---|
| 4,868,428 A | * | 9/1989 | Cooper | H03H 7/20 375/301 |
| 5,329,546 A | * | 7/1994 | Lee | H04B 1/707 375/147 |

(Continued)

*Primary Examiner* — Jinsong Hu
*Assistant Examiner* — Rui M Hu

(57) ABSTRACT

The present disclosure provides a mixing circuit with high harmonic suppression ratio, including: a multi-phase generation module, which receives a first input signal and generates eight first square wave signals with a phase difference of 45°; a quadrature phase generation module, which receives a second input signal and generates four second square wave signals with a phase difference of 90°; a harmonic suppression module, connected with an output end of the quadrature phase generation module to filter out higher order harmonic components in the second square wave signals; and a mixing module, connected with output ends of the multi-phase generation module and the harmonic suppression module to mix output signals of the multi-phase generation module and the harmonic suppression module. The mixing circuit with high harmonic suppression ratio adds a harmonic suppression module on the basis of multi-phase mixing, thereby improving the harmonic suppression ratio of the output signal.

7 Claims, 3 Drawing Sheets

(56) References Cited

U.S. PATENT DOCUMENTS

| | | | | |
|---|---|---|---|---|
| 6,307,894 B2* | 10/2001 | Eidson | H04L 27/2071 | 375/302 |
| 7,558,351 B2* | 7/2009 | Yang | H03H 7/21 | 375/350 |
| 7,610,032 B2* | 10/2009 | Davis | H03D 7/14 | 455/313 |
| 8,461,901 B1* | 6/2013 | Morton | H03D 7/165 | 455/323 |
| 8,670,739 B1* | 3/2014 | Murphy | H04B 1/1027 | 375/350 |
| 9,559,792 B1* | 1/2017 | Amir-Aslanzadeh | H04B 17/12 | |
| 9,960,883 B1* | 5/2018 | Chakraborty | H03D 7/165 | |
| 10,305,522 B1* | 5/2019 | Asuri | H04B 1/0028 | |
| 10,374,552 B1* | 8/2019 | Jansen | H03D 7/145 | |
| 10,630,239 B1* | 4/2020 | Mittal | H03K 3/017 | |
| 2004/0214547 A1* | 10/2004 | Kim | H03D 7/1433 | 455/296 |
| 2005/0070242 A1* | 3/2005 | Davis | H03C 3/40 | 455/293 |
| 2005/0175132 A1* | 8/2005 | Yang | H03H 7/21 | 375/350 |
| 2005/0215223 A1* | 9/2005 | Lin | H03D 7/1441 | 455/317 |
| 2005/0233723 A1* | 10/2005 | Gomez | H03D 7/1441 | 455/313 |
| 2005/0239430 A1* | 10/2005 | Shah | H03D 7/1483 | 455/302 |
| 2006/0160518 A1* | 7/2006 | Seendripu | H03D 3/007 | 455/323 |
| 2006/0205370 A1* | 9/2006 | Hayashi | H03D 7/1441 | 455/209 |
| 2006/0229011 A1* | 10/2006 | Naitou | H03D 7/14 | 455/39 |
| 2007/0072575 A1* | 3/2007 | Sowlati | H03L 7/0992 | 455/318 |
| 2008/0056337 A1* | 3/2008 | Tal | H03B 21/02 | 331/37 |
| 2009/0143031 A1* | 6/2009 | Shah | H04B 1/28 | 455/150.1 |
| 2009/0156155 A1* | 6/2009 | Krug | H04N 21/4382 | 455/313 |
| 2009/0325510 A1* | 12/2009 | Pullela | H03D 7/1441 | 327/551 |
| 2010/0117712 A1* | 5/2010 | Huang | H03D 7/1458 | 327/361 |
| 2010/0120377 A1* | 5/2010 | He | H03D 7/1441 | 455/118 |
| 2010/0253412 A1* | 10/2010 | Brekelmans | H03D 7/165 | 327/361 |
| 2011/0136460 A1* | 6/2011 | Cho | H03D 7/165 | 327/356 |
| 2011/0188601 A1* | 8/2011 | Ko | H04L 27/04 | 375/295 |
| 2011/0222633 A1* | 9/2011 | Pullela | H03D 7/165 | 375/318 |
| 2011/0298521 A1* | 12/2011 | Ru | H03D 7/1458 | 327/356 |
| 2012/0094620 A1* | 4/2012 | Lu | H04B 1/0053 | 455/90.2 |
| 2012/0163493 A1* | 6/2012 | Kim | H03D 7/163 | 375/295 |
| 2012/0322398 A1* | 12/2012 | Pullela | H03D 7/1466 | 455/302 |
| 2013/0009688 A1* | 1/2013 | Din | H03D 7/165 | 327/356 |
| 2013/0010848 A1* | 1/2013 | Shimizu | H04N 21/43637 | 375/295 |
| 2013/0094270 A1* | 4/2013 | Kitsunezuka | H03D 7/163 | 363/157 |
| 2013/0102266 A1* | 4/2013 | Kitsunezuka | H04B 1/10 | 455/263 |
| 2013/0130632 A1* | 5/2013 | Oishi | H04B 1/403 | 455/84 |
| 2013/0196611 A1* | 8/2013 | Duez | H03D 7/165 | 455/326 |
| 2014/0038542 A1* | 2/2014 | Rafi | H03D 7/1441 | 455/326 |
| 2014/0169237 A1* | 6/2014 | Furuta | H04B 1/0475 | 370/278 |
| 2015/0094004 A1* | 4/2015 | Vora | H03D 7/1466 | 455/114.1 |
| 2015/0126140 A1* | 5/2015 | Un | H04B 1/0475 | 455/114.1 |
| 2015/0372701 A1* | 12/2015 | Wang | H04L 27/364 | 375/296 |
| 2016/0380593 A1* | 12/2016 | Lu | H03H 11/0405 | 327/361 |
| 2017/0294878 A1* | 10/2017 | Tseng | H03D 7/165 | |
| 2017/0302308 A1* | 10/2017 | Jiang | H04B 1/0475 | |
| 2018/0041168 A1* | 2/2018 | Bhagavatula | H03D 7/1483 | |
| 2019/0199334 A1* | 6/2019 | Chakraborty | H04B 7/0452 | |
| 2019/0207288 A1* | 7/2019 | Zhu | H04B 1/18 | |
| 2019/0207565 A1* | 7/2019 | de Vreede | H04B 1/0483 | |
| 2020/0042031 A1* | 2/2020 | Connell | H03K 5/15066 | |
| 2022/0085762 A1* | 3/2022 | Delos | H03D 7/165 | |
| 2022/0123772 A1* | 4/2022 | Han | H04B 1/12 | |

\* cited by examiner

MIXING CIRCUIT WITH HIGH HARMONIC SUPPRESSION RATIO

CROSS REFERENCE TO RELATED APPLICATION

The present application is related to and claims the benefit of priority to Chinese Patent Application No. 2020101397004, entitled "Mixing Circuit with High Harmonic Suppression Ratio", filed with CNIPA on Mar. 3, 2020, the contents of which are incorporated herein by reference in its entirety.

BACKGROUND

Field of Disclosure

The present disclosure relates to the field of wireless communication technology, in particular, to a mixing circuit with high harmonic suppression ratio.

Description of Related Arts

In recent years, with the development of portable devices and the increase in consumer scenarios, people's demand for various wireless products is also increasing, and mixers have been playing an important role in wireless transceivers. At the transmitting end, the mixer up-converts the intermediate frequency signal to the radio frequency band, thereby making the antenna size smaller and the device more portable. At the receiving end, the mixer needs to down-convert the wanted signal from the radio frequency band to the intermediate frequency band. After the digital-to-analog conversion operation, the signal is more conducive to using the existing powerful digital signal processing capabilities to analyze and process the received signal. Besides, the lower intermediate frequency reduces the difficulty to design the analog circuits. In the clock network, with the enrichment of wireless application scenarios, transceivers that meet various protocols such as WIFI, Bluetooth, and GPS need to be integrated on the same chip, which requires more complex local oscillator frequencies. Mixers also play an important role. On the other hand, to avoid mutual interference within the chip in high-power application scenarios, the use of mixers to generate non-integer multiples of up/down mixing has long been a common clock generation solution in the industry. Therefore, for transmitting, receiving or frequency synthesis modules, it has great significance to design a high-performance mixer.

For a long time, people have used image suppression ratio as an important indicator to measure the performance of mixers, but they often ignore the deterioration of signal quality by higher order harmonics. In transceivers, the lower the intermediate frequency, the higher order intermodulation interferences are closer to the required spectral line. And the frequency synthesis module has the same problem. The deterioration of the local oscillation signal of the up/down mixing will further deteriorate the performance of the transmitter and receiver. Therefore, the suppression of higher order harmonics is a very difficult problem that must be solved in the process of designing high-performance mixers.

Therefore, it has become one of the problems to be solved by those skilled in the art to propose a mixer that can solve the higher order intermodulation interferences in the output signal.

SUMMARY

The present disclosure provides a mixing circuit with high harmonic suppression ratio, to solve the problem that the higher order intermodulation interferences in the output signal of the mixer in the prior art affect the signal quality.

The present disclosure provides a mixing circuit with high harmonic suppression ratio, which at least includes: a multi-phase generation module, which receives a first input signal and generates eight first square wave signals with a phase difference of 45°; a quadrature phase generation module, which receives a second input signal and generates four second square wave signals with a phase difference of 90°; a harmonic suppression module, connected with an output end of the quadrature phase generation module to filter out higher order harmonic components in the second square wave signals; and a mixing module, connected with output ends of the multi-phase generation module and the harmonic suppression module to mix output signals of the multi-phase generation module and the harmonic suppression module.

Optionally, the first square wave signals are the same frequency signals or frequency division signals of the first input signal.

Optionally, the multi-phase generation module includes a first limiting amplifier unit, which receives the first input signal and amplifies the first input signal into a rail-to-rail signal; and a first frequency division unit, connected with an output end of the first limiting amplifier unit, and dividing a frequency of an output signal of the first limiting amplifier unit.

More optionally, the first input signal is a pair of differential signals.

Optionally, the second square wave signals are the same frequency signals or frequency division signals of the second input signal.

Optionally, the quadrature phase generation module includes a second limiting amplifier unit, which receives the second input signal and amplifies the second input signal into a rail-to-rail signal; and a second frequency division unit, connected with an output end of the second limiting amplifier unit, and dividing a frequency of an output signal of the second limiting amplifier unit.

More optionally, the second input signal is a pair of differential signals.

Optionally, the harmonic suppression module includes a low-pass filter unit.

Optionally, the mixing module includes a Gilbert mixing unit.

More optionally, the Gilbert mixing unit includes three subunits with a tail current ratio of $1:\sqrt{2}:1$.

As described above, the mixing circuit with high harmonic suppression ratio of the present disclosure has the following beneficial effects:

The mixing circuit with high harmonic suppression ratio of the present disclosure adds a harmonic suppression module on the basis of multi-phase mixing to filter out higher order harmonic components of the signal at the input end, thereby improving the harmonic suppression ratio of the output signal.

DESCRIPTION OF REFERENCE NUMERALS

Figure 1:
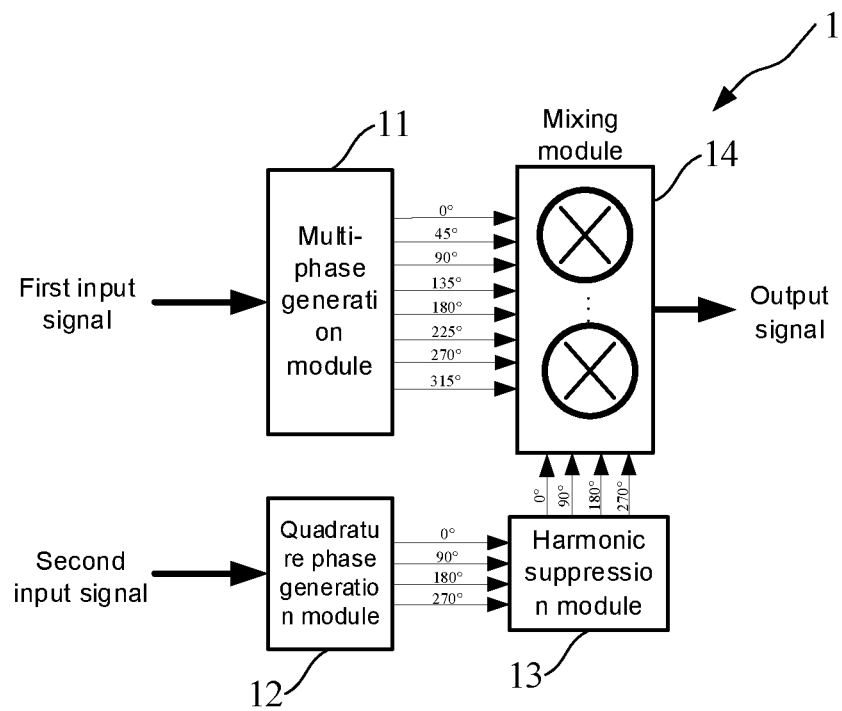
FIG. 1 shows a schematic view of a mixing circuit with high harmonic suppression ratio according to the present disclosure.

1 Mixing circuit with high harmonic suppression ratio
11 Multi-phase generation module
111 First limiting amplifier unit
112 First frequency division unit
12 Quadrature phase generation module
121 Second limiting amplifier unit
122 Second frequency division unit
13 Harmonic suppression module
14 Mixing module
141 Gilbert mixing unit
1411 First subunit
1412 Second subunit
1413 Third subunit

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-5. It needs to be stated that the drawings provided in the following embodiments are just used for schematically describing the basic concept of the present disclosure, thus only illustrating components only related to the present disclosure and are not drawn according to the numbers, shapes, and sizes of components during actual implementation, the configuration, number and scale of each component during actual implementation thereof may be freely changed, and the component layout configuration thereof may be more complicated.

In actual circuit applications, there is no ideal single tone signal. If there are higher order harmonics, it will deteriorate the output signal quality of the mixer. Taking the upmixer in the transmitter as an example, if there are higher order harmonics in the local oscillator signal, then:

$$V_{out} = (\alpha_1 A_1 \cos\omega_1 t + \alpha_3^3 A_3^3 \cos^3\omega_1 t)\cos\omega_2 t -$$
$$(\alpha_1 A_1 \sin\omega_1 t + \alpha_3^3 A_3^3 \sin^3\omega_1 t)\sin\omega_2 t =$$
$$\left(\alpha_1 A_1 + \frac{3\alpha_3 A_1^3}{4}\right)\cos(\omega_1 + \omega_2)t + \frac{\alpha_3 A_1^3}{4}(3\omega_1 - \omega_2)t$$

In the formula, $\alpha_1$ represents the amplification factor of the local oscillation signal fundamental after passing through the non-linear circuit, $\alpha_3$ represents the amplification factor of the local oscillation $3^{rd}$ harmonic after passing through the non-linear circuit, $A_1$ represents the local oscillation fundamental amplitude, $A_3$ represents the local oscillation $3^{rd}$ harmonic amplitude, $\omega_1$ represents the local oscillation frequency, $\omega_2$ represents the baseband signal frequency. In the above formula, the first term is the desired result, the second term is the result of $4^{th}$ order intermodulations between the local oscillation and the baseband signal, and the second term will deteriorate the output result. The above formula only considers the higher order harmonics of the local oscillation signal. If the higher order harmonics in the baseband signal are also considered in the calculation at the same time, it is not difficult to find that the final result will contain the term $(3\omega_2-\omega_1)$. Generally speaking, the baseband signal frequency is low, then the term $(3\omega_2-\omega_1)$ will be very close to $\omega_1$, and it cannot be filtered by the on-chip LC resonance network, which will deteriorate the output signal drastically. This situation is also severe in the local oscillation generation circuit, which may completely distort the generated local oscillation signal. With the effect of the back-end buffer, the distortion effect will be more worse.

Referring to FIG. 1, the present disclosure provides a mixing circuit 1 with high harmonic suppression ratio, which includes: a multi-phase generation module 11, a quadrature phase generation module 12, a harmonic suppression module 13, and a mixing module 14.

As shown in FIG. 1, the multi-phase generation module 11 receives a first input signal and generates eight first square wave signals with a phase difference of 45°.

Specifically, the multi-phase generation module 11 extracts the signal frequency of the first input signal, and generates eight square wave signals with the same frequency or with frequency division and a phase difference of 45°. In this embodiment, the phases of the first square wave signals are 0°, 45°, 90°, 135°, 180°, 225°, 270°, and 315°, respectively.

Figure 2:
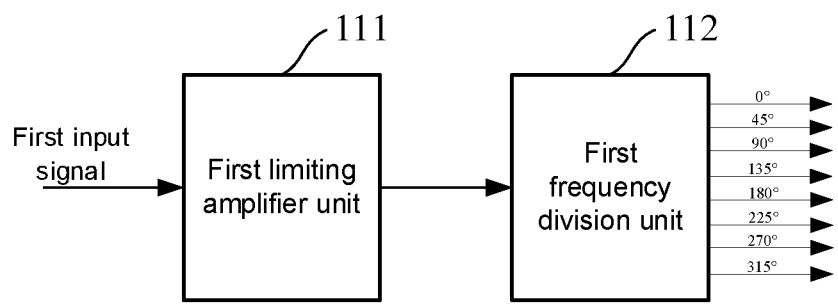
FIG. 2 shows a schematic view of a multi-phase generation module according to the present disclosure.

Specifically, as shown in FIG. 2, in this embodiment, the multi-phase generation module 11 includes a first limiting amplifier unit 111 and a first frequency division unit 112. The first limiting amplifier unit 111 receives the first input signal and amplifies the first input signal into a rail-to-rail signal. The first frequency division unit 112 is connected with the output end of the first limiting amplifier unit 111, and divides the frequency of the output signal of the first limiting amplifier unit 111. As an example, the first input signal is a pair of differential signals and the frequency is f1, and the first frequency division unit 112 is a divide-by-four divider, which divides two signals by four to obtain eight signals.

It should be noted that the first input signal may be one signal, which is divided by eight to obtain eight signals.

As shown in FIG. 1, the quadrature phase generation module 12 receives the second input signal and generates four second square wave signals with a phase difference of 90°.

Specifically, the quadrature phase generation module 12 extracts the signal frequency of the second input signal, and generates four square wave signals with the same frequency or with frequency division and a phase difference of 90°. In this embodiment, the phases of the second square wave signals are 0°, 90°, 180°, and 270°, respectively.

Figure 3:
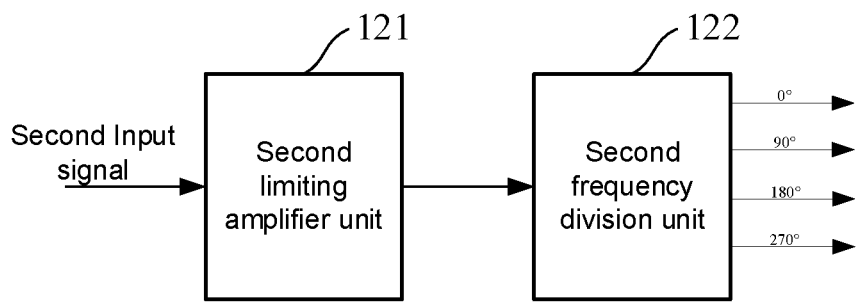
FIG. 3 shows a schematic view of a quadrature phase generation module according to the present disclosure.

Specifically, as shown in FIG. 3, in this embodiment, the quadrature phase generation module 12 includes a second limiting amplifier unit 121 and a second frequency division unit 122. The second limiting amplifier unit 121 receives the second input signal and amplifies the second input signal into a rail-to-rail signal. The second frequency division unit 122 is connected with the output end of the second limiting amplifier unit 121, and divides the frequency of the output signal of the second limiting amplifier unit 121. As an example, the second input signal is a pair of differential signals and the frequency is f2, and the second frequency division unit 122 is a divide-by-two divider, which divides two signals by two to obtain four signals.

It should be noted that the second input signal may be one signal, which is divided by four to obtain four signals.

As shown in FIG. 1, the harmonic suppression module 13 is connected with the output end of the quadrature phase generation module 12 and is used to filter out higher order harmonic components in the second square wave signals.

Specifically, the harmonic suppression module 13 filters the higher order harmonics in the four square wave signals with a phase difference of 90 degrees output by the quadrature phase generation module 12, and outputs four signals of the same frequency or frequency division with a phase difference of 90° containing only the fundamental frequency, to suppress higher order harmonic components in the output signal of the quadrature phase generation module 12. The harmonic suppression module 13 is a key module for suppressing the $4^{th}$ intermodulation signals of the radio frequency mixer.

Figure 4:
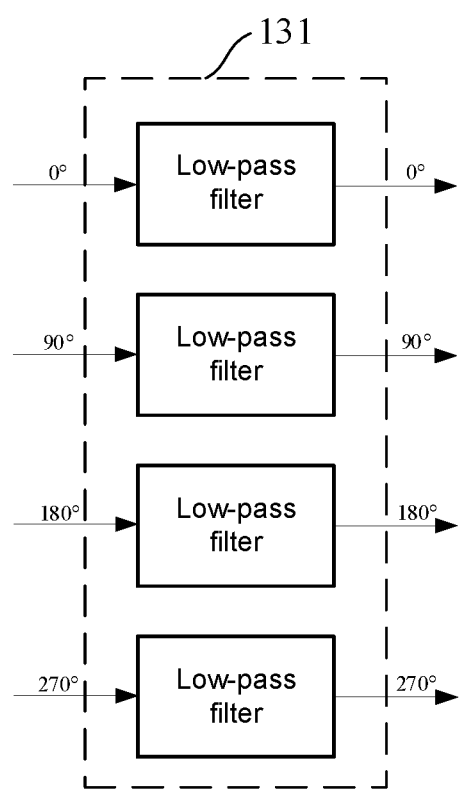
FIG. 4 shows a schematic view of a harmonic suppression module according to the present disclosure.

Specifically, as shown in FIG. 4, in this embodiment, the harmonic suppression module 13 includes a low-pass filter unit 131, and the low-pass filter unit 131 includes four low-pass filters, which respectively low-pass filters the four signals output by the quadrature phase generation module 12.

As shown in FIG. 1, the mixing module 14 is connected with the output ends of the multi-phase generation module 11 and the harmonic suppression module 13, and mixes the output signals of the multi-phase generation module 11 and the harmonic suppression module 13.

Figure 5:
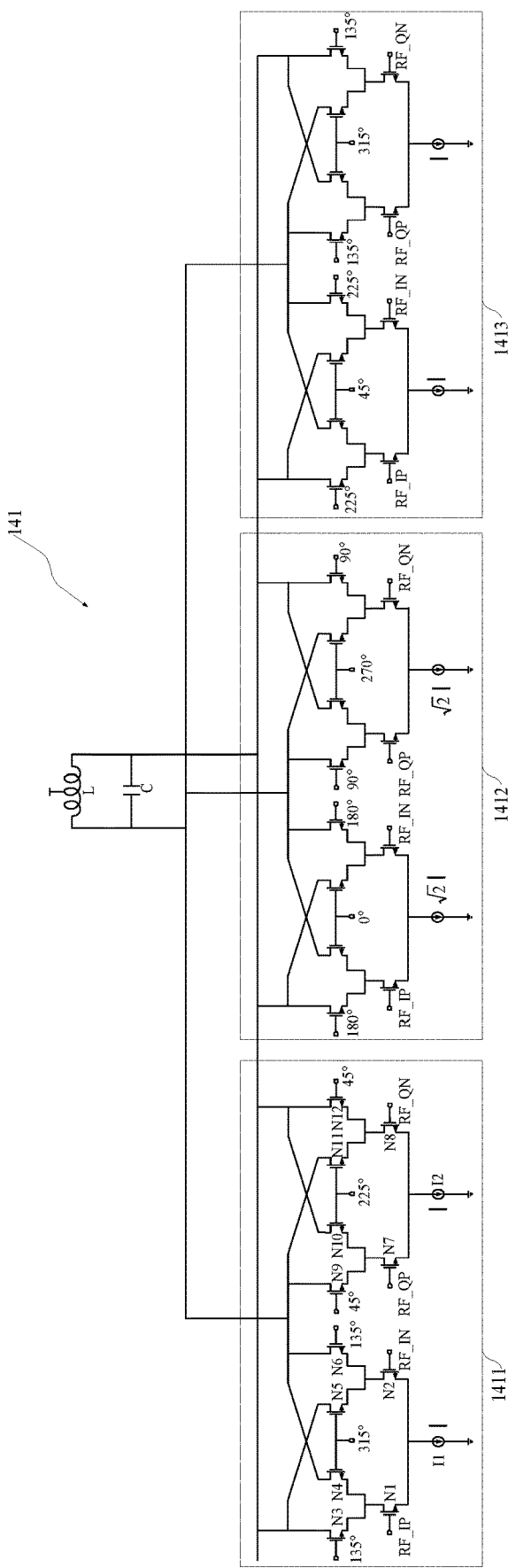
FIG. 5 shows a schematic view of a Gilbert mixing unit according to the present disclosure.

Specifically, the mixing module 14 is used to implement up-conversion or down-conversion. As shown in FIG. 5, in this embodiment, the mixing module 14 includes a Gilbert mixing unit 141. The Gilbert mixing unit 141 includes three subunits with a tail current ratio of $1:\sqrt{2}:1$, which are recorded as the first subunit 1411, second subunit 1412, and third subunit 1413, respectively. The tail current ratio of the first subunit 1411, the second subunit 1412 and the third subunit 1413 is $1:\sqrt{2}:1$. Specifically, each sub-unit includes first, second, third, fourth, fifth, sixth, seventh, eighth, ninth, tenth, eleventh, and twelfth transistors, and first, second current sources. The third transistor N3 and the fourth transistor N4 form a differential pair of transistors, the gates of the third transistor N3 and the fourth transistor N4 serve as first local oscillation differential signal input ends, the drain of the third transistor N3 is connected with the first end of the inductor L and capacitor C which are in parallel, the drain of the fourth transistor N4 is connected with the second end of the inductor L and the capacitor C which are in parallel, and the sources of the third transistor N3 and the fourth transistor N4 are connected with the drain of the first transistor N1. The connection relationship of the fifth transistor N5, the sixth transistor N6, and the second transistor N2 is the same as the connection relationship of the third transistor N3, the fourth transistor N4, and the first transistor N1, which will not be repeated here.

The first transistor N1 and the second transistor N2 form a differential pair of transistors, the gates of the first transistor N1 and the second transistor N2 serve as first radio frequency differential signal input ends, the sources of the first transistor N1 and the second transistor N2 are connected with an end of the first current source I1, and the other end of the first current source I1 is grounded. The connection relationship of the seventh transistor N7, the eighth transistor N8, the ninth transistor N9, the tenth transistor N10, the eleventh transistor N11, the twelfth transistor N12 and the second current source I2 is the same, which will not be repeated here. The gates of the ninth transistor N9, the tenth transistor N10, the eleventh transistor N11, and the twelfth transistor N12 respectively serve as second local oscillation differential signal input ends. The gates of the seventh transistor N7 and the eighth transistor N8 respectively serve as second radio frequency differential signal input ends, and the currents flowing through the first current source I1 and the second current source I2 are the same. The first local oscillation differential signal input end of the first subunit 1411 receives the signals with the phases of 135° and 315° in the first square wave signals. The second local oscillation differential signal input end of the first subunit 1411 receives the signals with the phases of 45° and 225° in the first square wave signals. The first radio frequency differential signal input end receives the first differential signals RF_IP and RF_IN, the second radio frequency differential signal input end receives the second differential signals RF_QP and RF_QN. The first differential signal and the second differential signal are orthogonal signals, and are respectively four signals with a phase difference of 90° in the second square wave signals. The connection relationship between the specific phase and the input end can be set according to actual needs.

The first local oscillation differential signal input end of the second subunit 1412 receives the signals with the phases of 180° and 0° in the first square wave signals. The second local oscillation differential signal input end of the second subunit 1412 receives the signals with the phases of 90° and 270° in the first square wave signals. The first radio frequency differential signal input end receives the first differential signals RF_IP and RF_IN, and the second radio frequency differential signal input end receives the second differential signals RF_QP and RF_QN. The first local oscillation differential signal input end of the third subunit 1413 receives the signals with the phases of 225° and 45° in the first square wave signals. The second local oscillation differential signal input end of the third subunit 1413 receives the signals with the phases of 135° and 315° in the first square wave signals. The first radio frequency differential signal input end receives the first differential signals RF_IP and RF_IN, and the second radio frequency differential signal input end receives the second differential signals RF_QP and RF_QN.

It should be noted that the structure and device type of the Gilbert mixing unit 141 are only examples, and in practical applications, any mixing module that can realize the mixing function applies to the present disclosure.

The working principle of the mixing circuit with high harmonic suppression ratio is as follows:

After the first input signal is input into the multi-phase generation module 11, it is amplified into a rail-to-rail signal by a limiting amplifier, and then it passes through a divide-by-four divider to generate eight square wave signals with phases of 0°, 45°, 90°, 135°, 180°, 225°, 270°, and 315°, which serve as a set of inputs of the mixing module 14. After the second input signal is input to the quadrature phase generation module 12, it is amplified into a rail-to-rail signal by a limiting amplifier, and then it passes through a divide-by-two divider to generate four square wave signals with phases of 0°, 90°, 180°, and 270°, respectively. The four square wave signals output by the quadrature phase generation module 12 are filtered by the low-pass filter in the harmonic suppression module 13 to remove higher order harmonics, and only the fundamental harmonics are retained as another set of inputs of the mixing module 14. In the mixing module 14, the two sets of signals are up-mixed or down-mixed. Since the higher order components in the signals are filtered out in the harmonic suppression module 13, the structure realizes the traditional mixing function and has a higher harmonic suppression ratio.

The core of the present disclosure is to propose a mixing circuit with high harmonic suppression ratio, which can not only suppress the image frequency, but also suppress higher order intermodulation signals.

In summary, the present disclosure provides a mixing circuit with high harmonic suppression ratio. The mixing circuit with high harmonic suppression ratio includes a multi-phase generation module, which receives a first input signal and generates eight first square wave signals with a phase difference of 45°; a quadrature phase generation module, which receives a second input signal and generates four second square wave signals with a phase difference of 90°; a harmonic suppression module connected with an output end of the quadrature phase generation module to filter out higher order harmonic components in the second square wave signals; and a mixing module connected with output ends of the multi-phase generation module and the harmonic suppression module to mix output signals of the multi-phase generation module and the harmonic suppression module. The mixing circuit with high harmonic suppression ratio of the present disclosure adds a harmonic suppression module on the basis of multi-phase mixing to filter out higher order harmonic components of the signal at the input end, thereby improving the harmonic suppression ratio of the output signal. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A mixing circuit with high harmonic suppression ratio, at least comprising:

a multi-phase generation module, which receives a first input signal and generates eight first square wave signals with a phase difference of 45°, wherein the eight first square wave signals and the first input signal are of the same frequency,
wherein the multi-phase generation module comprises:
a first limiting amplifier unit, which receives the first input signal and amplifies the first input signal into a rail-to-rail signal; and
a first frequency division unit, connected with an output end of the first limiting amplifier unit, and generating the eight first square signals based on the rail-to-rail signal;

a quadrature phase generation module, which receives a second input signal and generates four second square wave signals with a phase difference of 90°, wherein the multi-phase generation module and the quadrature phase generation module have inputs independent of each other;

a harmonic suppression module, connected with an output end of the quadrature phase generation module to filter out higher order harmonic components in the second square wave signals, wherein the harmonic suppression module includes four low-pass filters, which respectively low-pass filters the four second square signals output by the quadrature phase generation module to remove higher order harmonics, and fundamental harmonics are retained by the low-pass filters; and a mixing module, connected with output ends of the multi-phase generation module and the harmonic suppression module to mix output signals of the multi-phase generation module and the fundamental harmonics retained by the low-pass filters of the harmonic suppression module.

2. The mixing circuit with high harmonic suppression ratio according to claim 1, wherein the first input signal is a pair of differential signals.

3. The mixing circuit with high harmonic suppression ratio according to claim 1, wherein the quadrature phase generation module comprises: a second limiting amplifier unit, which receives the second input signal and amplifies the second input signal into a rail-to-rail signal; and a second frequency division unit, connected with an output end of the second limiting amplifier unit, and dividing a frequency of an output signal of the second limiting amplifier unit.

4. The mixing circuit with high harmonic suppression ratio according to claim 3, wherein the second input signal is a pair of differential signals.

5. The mixing circuit with high harmonic suppression ratio according to claim 1, wherein the second input signal is a pair of differential signals.

6. The mixing circuit with high harmonic suppression ratio according to claim 1, wherein the mixing module comprises a Gilbert mixing unit.

7. The mixing circuit with high harmonic suppression ratio according to claim 6, wherein the Gilbert mixing unit comprises three subunits with a tail current ratio of $1:\sqrt{2}:1$.

* * * * *